United States Patent
Dobritz et al.

(10) Patent No.: US 6,946,721 B2
(45) Date of Patent: Sep. 20, 2005

(54) LEADFRAME OF A CONDUCTIVE MATERIAL AND COMPONENT WITH A LEADFRAME OF A CONDUCTIVE MATERIAL

(75) Inventors: Stephan Dobritz, Dresden (DE); Knut Kahlisch, Dresden (DE); Steffen Kröhnert, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/306,184

(22) Filed: Nov. 27, 2002

(65) Prior Publication Data

US 2003/0098498 A1 May 29, 2003

(30) Foreign Application Priority Data

Nov. 29, 2001 (DE) .......................... 101 58 770

(51) Int. Cl.[7] .......................... H01L 23/50; H01L 23/34; H01L 23/495; H01L 23/48; B23K 31/02
(52) U.S. Cl. .................. 257/666; 257/676; 257/696; 257/698; 257/674; 257/671; 257/672; 257/673
(58) Field of Search .................. 257/666, 667, 257/669–674, 696, 698, 692, 693

(56) References Cited

U.S. PATENT DOCUMENTS

| | | | | |
|---|---|---|---|---|
| 4,234,666 A | * | 11/1980 | Gursky | 428/573 |
| 4,400,714 A | * | 8/1983 | Brown | 257/669 |
| 5,072,279 A | | 12/1991 | Roth | |
| 5,150,194 A | * | 9/1992 | Brooks et al. | 257/670 |
| 5,162,894 A | * | 11/1992 | Asano et al. | 257/691 |
| 5,489,059 A | * | 2/1996 | Rostoker et al. | 228/175 |
| 5,550,402 A | * | 8/1996 | Nicklaus | 257/669 |
| 5,554,886 A | * | 9/1996 | Song | 257/666 |
| 5,708,293 A | * | 1/1998 | Ochi et al. | 257/666 |
| 5,808,355 A | | 9/1998 | Kim et al. | |
| 5,859,471 A | * | 1/1999 | Kuraishi et al. | 257/666 |
| 5,949,132 A | * | 9/1999 | Libres et al. | 257/666 |
| 5,998,866 A | * | 12/1999 | Ochi et al. | 257/727 |
| 6,046,504 A | * | 4/2000 | Kimura | 257/775 |
| 6,063,650 A | * | 5/2000 | King et al. | 438/123 |
| 6,121,673 A | | 9/2000 | Kinsman | |
| 6,144,088 A | * | 11/2000 | Pohl et al. | 257/666 |
| 6,150,709 A | * | 11/2000 | Shin et al. | 257/666 |
| 6,153,922 A | | 11/2000 | Sugiyama et al. | |
| 6,201,297 B1 | * | 3/2001 | Masuda | 257/690 |
| 6,297,544 B1 | | 10/2001 | Nakamura et al. | |
| 6,521,987 B1 | * | 2/2003 | Glenn et al. | 257/684 |
| 2002/0027270 A1 | * | 3/2002 | Iwakiri | 257/670 |
| 2003/0038162 A1 | * | 2/2003 | Chew et al. | 228/180.21 |
| 2003/0162326 A1 | * | 8/2003 | Tsubosaki et al. | 438/109 |

FOREIGN PATENT DOCUMENTS

| | | | |
|---|---|---|---|
| DE | 197 49 539 A1 | | 9/1998 |
| EP | 0 843 356 A2 | | 5/1998 |
| JP | 2000-223611 | * | 8/2000 |
| WO | 8303164 | * | 9/1983 |

\* cited by examiner

Primary Examiner—Alexander Oscar Williams
(74) Attorney, Agent, or Firm—Laurence A. Greenberg; Werner H. Stemer; Ralph E. Locher

(57) ABSTRACT

A leadframe of a conductive material includes a central region to accommodate a chip and a plurality of connecting fingers extending at least from one side in the direction of the central region, a contact region being provided adjacent to the central region on at least some of the connecting fingers. The course of the connecting fingers is such that a sectional face in an arbitrary imaginary cross-section at right angles to the main face of the leadframe has leadframe material. In such a case, it is attempted to keep cross-sections in a component without leadframe material as small as possible.

14 Claims, 4 Drawing Sheets

PRIOR ART FIG 6

LEADFRAME OF A CONDUCTIVE MATERIAL AND COMPONENT WITH A LEADFRAME OF A CONDUCTIVE MATERIAL

BACKGROUND OF THE INVENTION

Field of the Invention

The invention relates to a leadframe of a conductive material, having a central region to accommodate a chip, and a plurality of connecting fingers that extend at least from one side in the direction of the central region, a contact region being provided adjacent to the central region on at least some of the connecting fingers. The invention relates further to a component including a chip, a leadframe of a conductive material, a central region and connecting fingers, and a housing of a molding compound, the chip having contact pads on its upper side that are connected electrically to the connecting fingers, and the housing enclosing the chip and regions of the connecting fingers.

Components of the above-mentioned type are also called Surface Mounted Device (SMD) components. There is a large number of different housing configurations, which are of different sizes and have a different number of connecting fingers. SMD components permit standardized production and automatic population of printed circuit boards to which they are applied.

A typical structure of an SMD component is described below. First, a chip is connected to a system carrier. The system carrier is frequently constructed as a leadframe and has a central region to accommodate a chip and a plurality of connecting fingers, which extend from at least one side in the direction of the central region. In some leadframes, the central region is configured as an island-like chip carrier. The chip is fitted to this chip carrier, for example, by adhesive bonding, soldering, or alloying, and connected firmly thereto. In another variant, the connecting fingers, themselves, form the central region. In such a case, the connecting fingers extend from at least two opposite sides in the direction of the central region. The chip is fixed to the leadframe such that an adhesive layer, generally in the form of an adhesive strip, is applied to the active main side of the chip. Regions of the connecting fingers are brought into contact with the adhesive to achieve retention of the chip. Such a configuration is also referred to as Lead On Chip (LOC). Its identifying feature is that the connecting fingers partly overlap the chip face, by which mechanical fixing of the chip is achieved. After the chip has been connected to the leadframe, its individual contact pads are connected to contact regions on the connecting fingers. The electrical connection is produced, for example, by bonding wires. The chip and the connecting fingers of the connecting frame are, then, encapsulated such that the chip is surrounded completely by a molding compound and the connecting fingers project to some extent out of the housing. The housing normally is of a curable plastic molding compound, which is processed at about 175 degrees C. The regions of the leadframe that are not needed are, then, removed by punching.

During the production of the component, during the fitting of the latter to a printed circuit board and during operation, both are subjected to high loadings. During production, the component is subjected to mechanical loadings as a result of bending the regions of the connecting fingers that are located outside the housing, or by punching out the parts of the leadframe that are not needed. When the component is soldered onto a printed circuit board, it is subjected to temperatures in the range between 220° and 240° C. Thus, thermal-mechanical stresses act on the component. During the operation of the component itself, high temperatures, likewise, arise that cause thermal stresses. These stresses arise as a result of the fact that the materials of the leadframe, of the housing, and of the chip, itself, have different coefficients of thermal expansion. Because of such a characteristic, shear stresses arise in the interior of the component. These shear stresses can cause delamination at the points at which leadframe material meets housing material. Furthermore, cracks can occur in the housing and in the chip. As a result of penetrating moisture, the component can, then, be impaired in terms of its ability to function. Cracks in the chip can lead to functional failure.

During the design of the components, attempts are, therefore, made to achieve neutral stress states as far as possible during manufacture by appropriate material selection, by the design of the leadframe, and by the process configuration. In particular, the configuration of the leadframe has a decisive influence on the ruggedness of the component with regard to process-induced stresses or forces on the housing, which are viewed as a latent cause for housing fractures that continually occur.

To avoid such difficulties, "downsets," as they are referred, are often provided. Such a configuration is used almost exclusively in leadframes with a chip island. In this case, the island-like chip carrier is offset upward or downward with respect to the connecting fingers. After the chip has been fitted and the housing has been provided, the chip is surrounded on its upper and lower side by a housing cover of equal thickness. By such measures, it is possible to reduce bending of the housing that is caused by different coefficients of expansion of the materials used (chip, plastic molding compound). The downset is provided regularly only for small chips.

Otherwise, the focus of the configuration of the leadframes lies in their electrical performance. The leadframes, that is to say, in particular, the shape of the connecting fingers, are optimized to short signal propagation paths and to a connection configuration in relation to the chip that is optimum for wire bonding. Leadframes that are provided for use in the aforementioned LOC housings are likewise configured only with regard to their electrical performance.

SUMMARY OF THE INVENTION

It is accordingly an object of the invention to provide a leadframe and component with a leadframe that overcome the hereinafore-mentioned disadvantages of the heretofore-known devices of this general type and that imparts a higher mechanical stability to a component so that damage, in particular, as a result of delamination, is largely avoided.

With the foregoing and other objects in view, there is provided, in accordance with the invention, a leadframe of a conductive material, including a main face, leadframe material, a central region for accommodating a chip, and connecting fingers extending at least from one side thereof in a direction of the central region, at least some of the connecting fingers having a contact region adjacent the central region, the connecting fingers having a course placing the leadframe material at a sectional face in an imaginary cross-section at right angles to the main face.

According to the invention, provision is made to configure the course of the connecting fingers such that the sectional face in an imaginary cross-section at right angles to the main face of the leadframe has leadframe material. If the leadframe according to the invention is disposed in a semiconductor component, then, the course of the connecting fingers in the interior of the housing is such that the sectional face in an arbitrary imaginary cross-section at right angles to the main face of the semiconductor component has leadframe material. As many sectional faces as desired can be imagined in every leadframe and in every semiconductor component. Regardless of how a section is made through the leadframe or the semiconductor component, provision is made for leadframe material to be disposed in the sectional face. The aim in such a case is to create similar conditions at all the conceivable cross-sections.

The invention is based on the finding that the leadframe plays the critical part in the ruggedness of the semiconductor component with respect to mechanical or thermal stresses. In conventional components, in particular, in components of LOC design, there are sectional faces that do not have any kind of leadframe material. These sectional faces, also referred to as fracture lines or stress lines, constitute a potential weak point in the housing, at which cracks often occur in the housing. On the basis that these fracture lines or cross-sections at which the cracks in the housing arise do not have any leadframe material, provision is now made to configure the leadframe, in particular, the connecting fingers such that each sectional face going through the leadframe or the semiconductor component has at least a low proportion of leadframe material. The ruggedness of the leadframe or of the semiconductor component becomes greater the more leadframe material is provided in relation to the other materials housing or chip. It is particularly advantageous if the relationship between leadframe material and the other materials occurring in the semiconductor component is approximately the same because, as such, potential weak points in the housing are avoided.

By the configuration according to the invention of the leadframe, account is also taken of the criteria of electrical performance and the connection configuration with regard to subsequent wire bonding. In such a case, the precise configuration of the connecting fingers can be determined only by an optimization procedure. However, a significant feature is that the housing is reinforced substantially in terms of the transverse stability, critical for the action of forces, with regard to fracture load or crack susceptibility.

In accordance with another feature of the invention, the connecting fingers are disposed in the leadframe such that they cross at least one of the sectional faces. If the fracture lines in the components in the prior art occur predominantly in the region of the axes of symmetry of the component, then the connecting fingers are, consequently, disposed such that at least those connecting fingers that are adjacent to the axis of symmetry of the leadframe cross the axis of symmetry. In principle, it is sufficient for only one connecting finger to cross one of the sectional faces. If the configuration of the leadframe permits, it is, of course, also possible for a plurality of connecting fingers, preferably adjacent connecting fingers, to cross a sectional face.

In accordance with a further feature of the invention, the connecting fingers are provided with material reinforcements so that the material reinforcements cross at least one of the sectional faces. In such a case, a material reinforcement can signify an enlargement of the width (in the plan view of the leadframe) of individual connecting fingers. However, material reinforcement also includes at least individual connecting fingers being changed in their thickness (as viewed in the cross-section of the leadframe). Which of the connecting fingers are provided with material reinforcements and how many of the connecting fingers are provided with such material reinforcements is an optimization process. The latter is carried out while taking account of the condition that, at all the conceivable cross-sections, the relationship of leadframe material to the other materials of the semiconductor component is approximately the same. The material reinforcements of the connecting fingers are, preferably, disposed at the points at which they cross an axis of symmetry of the leadframe or semiconductor component.

In accordance with an added feature of the invention, the main face has two axes of symmetry and at least the connecting fingers adjacent each of the axes of symmetry cross at least a respective one of the axes of symmetry.

Although the material reinforcements can, in principle, have any conceivable shape, it has proven to be advantageous to configure the reinforcements in the shape of an anchor or a paddle.

Because the abovementioned material reinforcements of at least individual connecting fingers also have effects on the electrical properties (for example, parasitic capacitances, signal coupling), it is advantageous if the connecting fingers that have material reinforcements are not intended to perform an electrical function. If such connecting fingers have to perform an electrical function, care should be taken to configure these connecting fingers as short as possible, in accordance with the electrical requirements.

In accordance with an additional feature of the invention, the connecting fingers having the material reinforcements are not be connected to the chip.

Furthermore, it is advantageous if connecting fingers with material reinforcements and connecting fingers without material reinforcements are disposed alternately. Such a configuration also takes into account the signal coupling between connecting fingers placed beside one another.

With the objects of the invention in view, there is also provided a leadframe, including a main face, a central region for accommodating a chip, and connecting fingers of a conductive leadframe material extending at least from one side thereof in a direction of the central region, at least some of the connecting fingers having a contact region adjacent the central region, the connecting fingers having a course placing the leadframe material at a sectional face in an imaginary cross-section at right angles to the main face.

With the objects of the invention in view, there is also provided a component, including a chip having an upper side and contact pads on the upper side, a leadframe of a conductive material, the leadframe having a main face, a central region, and connecting fingers electrically connected to the contact pads, a housing of a molding compound enclosing the chip and regions of the connecting fingers, the housing having an interior, and the connecting fingers having a course in the interior of the housing placing the material of the leadframe at a sectional face in an arbitrary imaginary cross-section at right angles to the main face.

In accordance with yet another feature of the invention, the central region accommodates the chip, the connecting fingers extend at least from one side thereof in a direction of the central region, at least some of the connecting fingers have a contact region adjacent the central region, and the connecting fingers have a course placing the material of the leadframe at the sectional face in the arbitrary imaginary cross-section at right angles to the main face.

In accordance with a concomitant feature of the invention, the central region accommodates the chip, the connecting fingers are of the conductive material and extend at least from one side thereof in a direction of the central region, at least some of the connecting fingers have a contact region adjacent the central region, and the connecting fingers have a course placing the material of the leadframe at the sectional face in the arbitrary imaginary cross-section at right angles to the main face.

Other features that are considered as characteristic for the invention are set forth in the appended claims.

Although the invention is illustrated and described herein as embodied in a leadframe and component with a leadframe, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 6 is a cross-sectional view of the leadframe of FIG. 3 along section line VI—VI.

DESCRIPTION OF THE PREFERRED EMBODIMENTS

Figure 1:
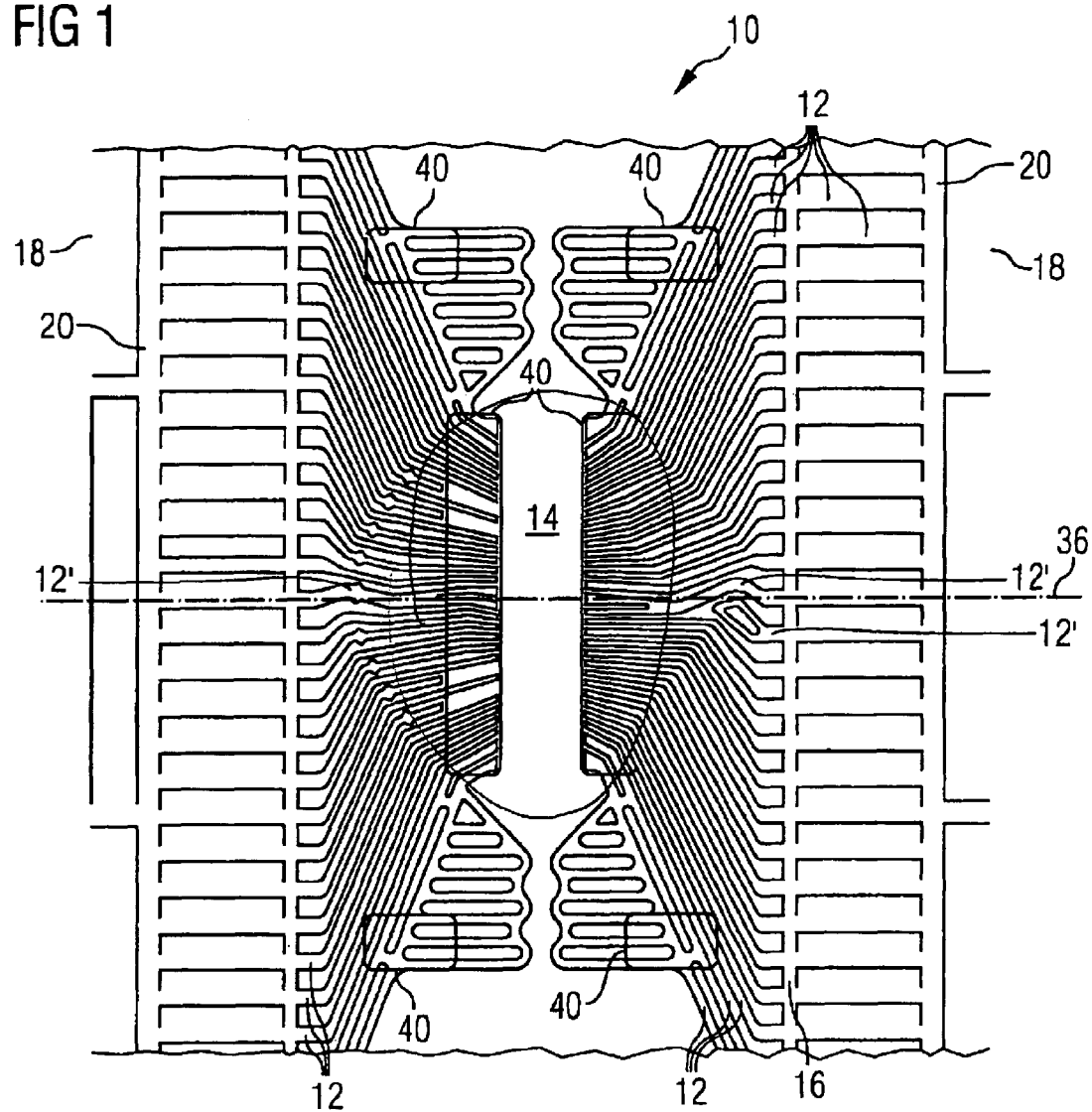
FIG. 1 is a fragmentary, plan view of a leadframe according to the invention.

Referring now to the figures of the drawings in detail and first, particularly to FIG. 1 thereof, there is shown an exemplary embodiment of a leadframe 10 according to the invention. The leadframe 10 has a large number of connecting fingers 12 that, for example, extend from two opposite sides in the direction of a central region 14. The present leadframe 10 is configured without an island-like chip carrier, that is to say, is provided for components using LOC technology. The individual connecting fingers 12 are interconnected by a sealing web 16, which is punched away after the fixing of a chip (which cannot be seen from the figure), and the provision of a non-illustrated housing. Likewise, the connecting webs 20 at the respective outer edge of the leadframe are punched away. There are elongate transport holes 18 in the connecting webs 20, using which the leadframe, usually present in strip form, can be transported in a processing tool. At the regions identified by the designation 40, an adhesive in the form of a double-sided adhesive tape is applied, with which the chip can be fixed to the leadframe 10. Depending on the size of the chip, only the adhesive areas 40 placed in the central region may be provided.

The leadframe 10 illustrated in FIG. 1 is distinguished by the fact that leadframe material is placed in any desired sectional face that runs at right angles to the main face of the leadframe and in the direction of the course of the connecting fingers. As an example, because, in practice, it is the most critical sectional face, the designation 36 shows a fracture line that is located on the axis of symmetry of the leadframe 10. As can be seen well from FIG. 1, the connecting fingers identified by the designation 12' cross the sectional face 36. The leadframe material of the connecting fingers 12' present in the sectional face leads to strengthening of the component.

Figure 3:
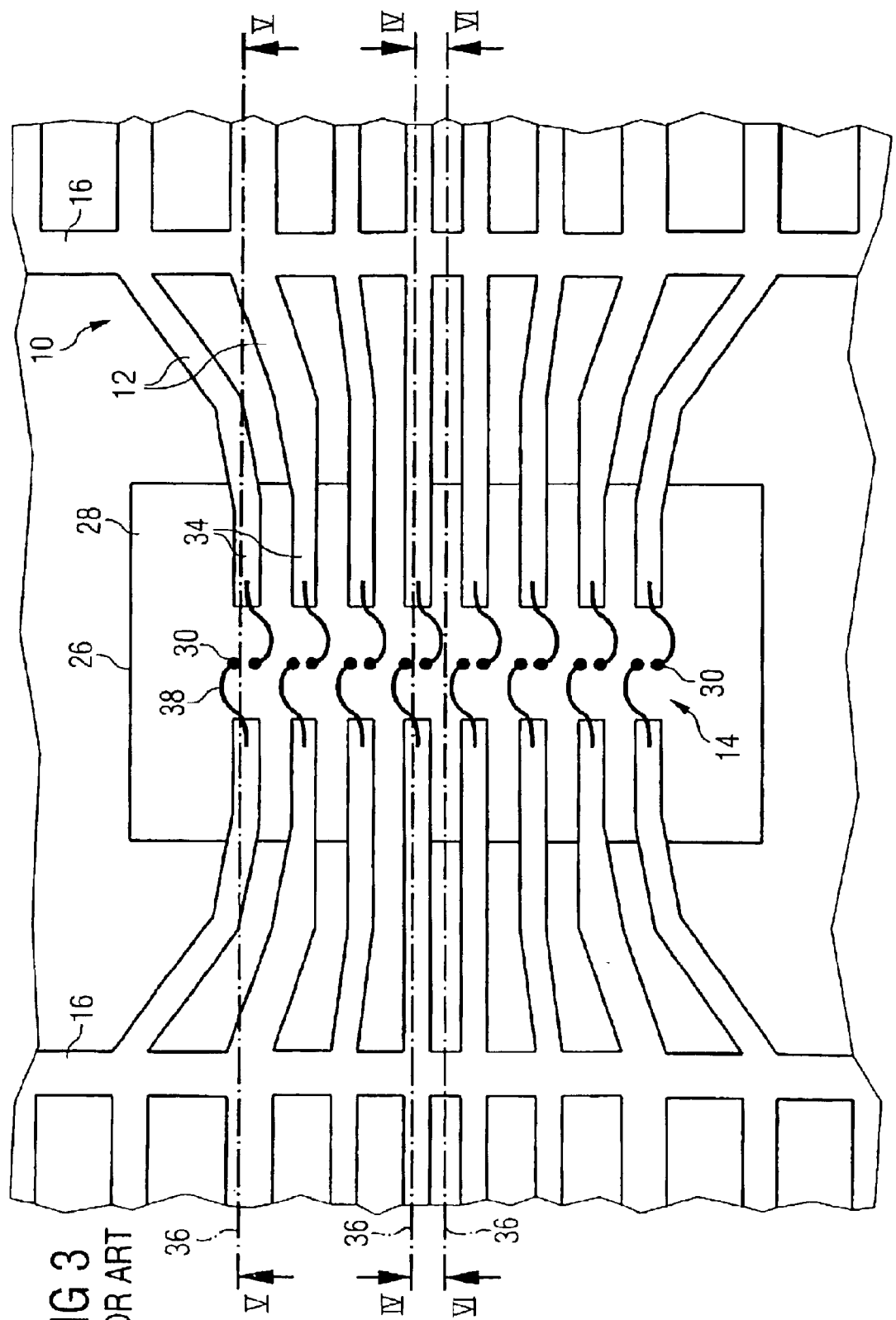
FIG. 3 is a fragmentary, plan view of a prior art leadframe.

In prior art leadframes, the sectional face in the region of the axis of symmetry of the leadframe or a semiconductor component generally has no leadframe material. Such a leadframe, in the prior art, is illustrated in FIG. 3. From this figure, the configuration of the chip 26 in the central region 14 of the leadframe can also be seen. The chip 26 is connected by its upper side to the connecting fingers 12 of the leadframe 10. In the mid-axis of the chip 26 there is a large number of contact pads 30, which are respectively connected through a bonding wire 38 to contact areas 34 at the ends of the connecting fingers 12.

Figure 4:
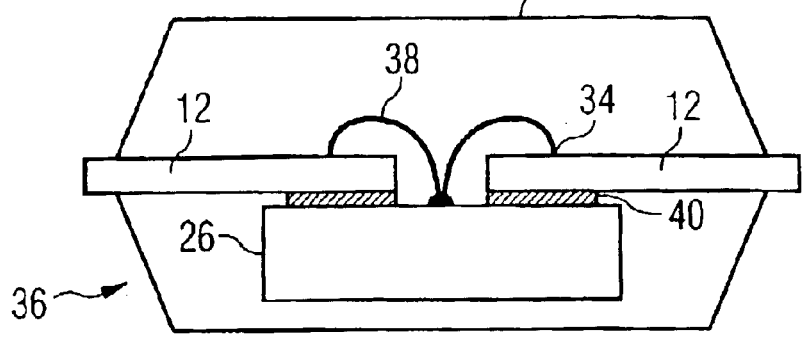
FIG. 4 is a cross-sectional view of the leadframe of FIG. 3 along section line IV—IV.
Figure 5:
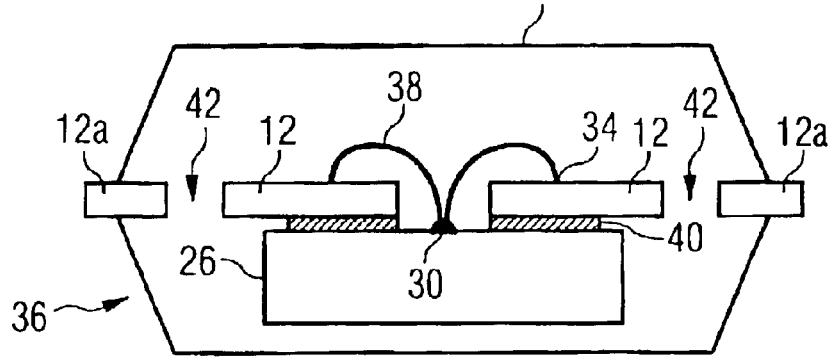
FIG. 5 is a cross-sectional view of the leadframe of FIG. 3 along section line V—V.
Figure 5:
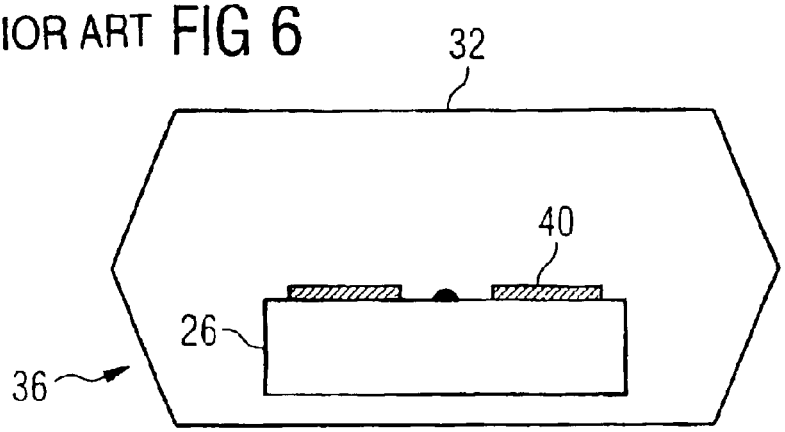

As an example, three sectional faces 36 (also designated a fracture line) are shown in FIG. 3, of which in each case the cross-section can be seen in FIGS. 4 to 6. The cross-sectional illustration in FIG. 4 represents an ideal sectional face with regard to fracture strength. In the cross-section of FIG. 4, the connecting fingers 12 each run without interruption. As a result, overall, a sectional face that can be loaded very highly mechanically is represented.

Capable of being loaded somewhat less is the cross-section illustrated in FIG. 5. Here, the regions shown with the designation 42 have housing material, that is to say, molding compound, instead of leadframe material. However, the housing material is substantially less stable than the leadframe material. The cross-sectional course of FIG. 5 can, therefore, be loaded less mechanically as compared with the cross-sectional course of FIG. 4.

The lowest ability to be loaded mechanically is exhibited by the cross-sectional course of FIG. 6. This cross-section runs in the region of the axis of symmetry of the leadframe from FIG. 3. Because, as can be seen well from FIG. 3, no connecting fingers run in the axis of symmetry, the cross-section in FIG. 6 does not have any leadframe material. This region, therefore, constitutes a potential weak point in a semiconductor component, at which cracks in the housing can arise as a result of mechanical or thermal loadings.

This potential weak point does not exist in the leadframe according to the invention according to FIG. 1 because there are no cross-sectional faces that have no leadframe material. The single exception is represented by a sectional face at right angles to the course of the connecting fingers. Because of the principle, this is the case in leadframes in which the connecting fingers extend from two opposite sides in the direction of the central region 14. In the case of a leadframe in which the connecting fingers extend from all four sides in the direction of the central region, the connecting fingers would run such that even the further axis of symmetry would be crossed by connecting fingers.

In principle, the connecting fingers can assume any conceivable course. However, because the electrical signal characteristics of each connecting finger have to be taken into account, it is expedient to change the course of only those connecting fingers that lie adjacent to a sectional face that, from the outset, has no leadframe material.

Figure 2A:
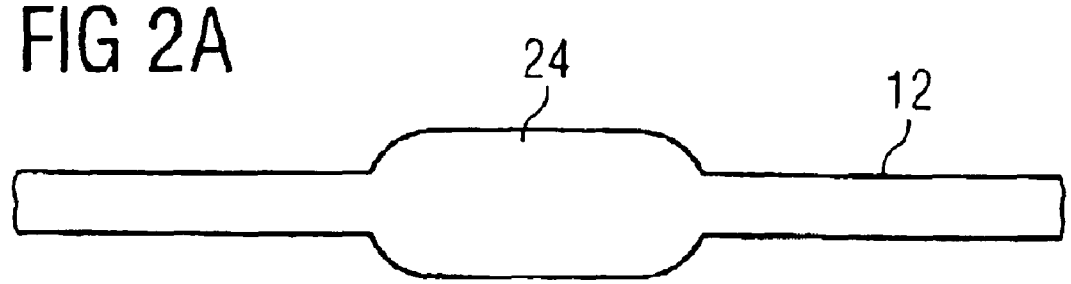
FIG. 2A is a fragmentary, plan view of a first exemplary embodiment of a connecting finger according to the invention.
Figure 2B:
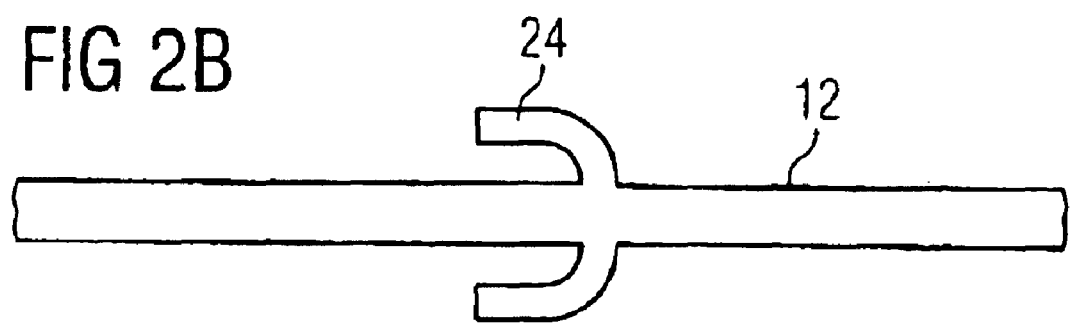
FIG. 2B is a fragmentary, plan view of a second exemplary embodiment of a connecting finger according to the invention.
Figure 2C:
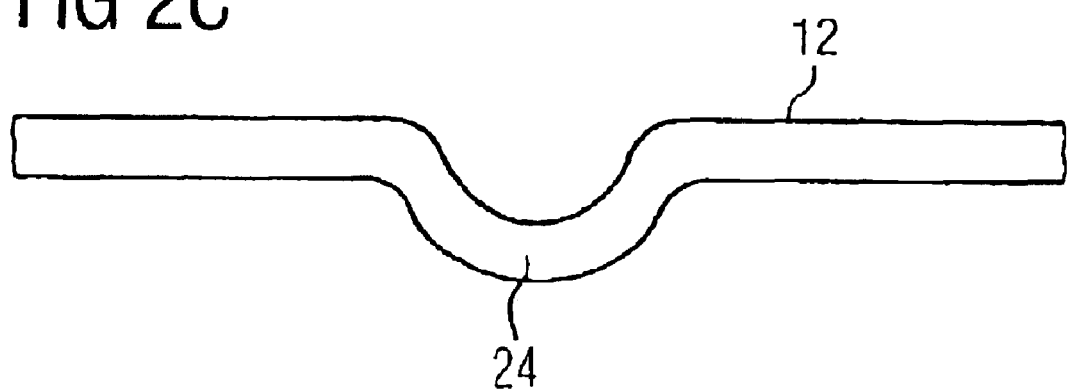
FIG. 2C is a fragmentary, plan view of a third exemplary embodiment of a connecting finger according to the invention.

Various embodiments of connecting fingers 12 are illustrated in FIGS. 2A to 2C. The connecting fingers 12 are in each case illustrated in a plan view. According to the exemplary embodiment of FIG. 2A, a connecting finger 12 can have a paddle-like reinforcement 24. The reinforcement, which corresponds to a broadening of the connecting finger 12 in a sub-area does not have to have the shape shown in this case but—depending on the space available—can be given any desired shape. Another exemplary embodiment is illustrated in FIG. 2B, in which the reinforcement is in the shape of an anchor. In such a case, the anchor can, of course, also be aligned in the other direction. A third exemplary embodiment is illustrated in FIG. 2C, in which the reinforcement is in the shape of a curve. The curve can, of course, take other shapes.

By optimum guidance of the connecting finger regions located in the interior of a housing, whilst taking account of existing design rules, the invention proposes keeping the critical housing cross-section, that is to say, the cross-section without leadframe material, as small as possible. The leadframe is, preferably, configured such that the relationship of leadframe material to the other materials (chip, housing) is approximately the same. Such a characteristic simply means that potential weak points in a semiconductor component can be avoided.

We claim:

1. A chip-island-free leadframe of a conductive material, comprising:
   a main face extending in a plane, having sides, and defining sectional faces in cross-sections at right angles to said plane;
   leadframe material;
   a central region for accommodating a chip; and
   connecting fingers extending at least from one side of said main face in a direction of said central region, at least some of said connecting fingers having a contact region adjacent said central region, said connecting fingers crossing at least one of said sectional faces, said connecting fingers having a course causing said connecting fingers to have said leadframe material at said at least one of said sectional faces, said connecting fingers having material reinforcements crossing at least one of said sectional faces, said connecting fingers having said material reinforcements being connecting fingers not to be connected to the chip.

2. The leadframe according to claim 1, wherein:
   said main face has an axis of symmetry; and
   at least said connecting fingers adjacent said axis of symmetry cross said axis of symmetry.

3. The leadframe according to claim 2, wherein at least said connecting fingers adjacent said axis of symmetry have material reinforcements crossing said axis of symmetry.

4. The leadframe according to claim 1, wherein:
   said main face has two axes of symmetry; and
   at least said connecting fingers adjacent each of said axes of symmetry cross at least a respective one of said axes of symmetry.

5. A chip-island-free leadframe of a conductive material, comprising:
   a main face extending in a plane, having sides, and defining sectional faces in cross-sections at right angles to said plane;
   leadframe material;
   a central region for accommodating a chip; and
   connecting fingers extending at least from one side of said main face in a direction of said central region, at least some of said connecting fingers having a contact region adjacent said central region, said connecting fingers crossing at least one of said sectional faces, said connecting fingers having a course causing said connecting fingers to have said leadframe material at said at least one of said sectional faces, said connecting fingers having material reinforcements crossing at least one of said sectional faces, said connecting fingers having said material reinforcements being connecting fingers not to be connected to the chip;
   said connecting fingers having said material reinforcements and said connecting fingers not having said material reinforcements being disposed alternatingly.

6. A chip-island-free leadframe of a conductive material, comprising:
   a main face extending in a plane, having sides, and defining sectional faces in cross-sections at right angles to said plane, said main face having an axis of symmetry;
   leadframe material;
   a central region for accommodating a chip; and
   connecting fingers extending at least from one side of said main face in a direction of said central region, at least some of said connecting fingers having a contact region adjacent said central region, said connecting fingers crossing at least one of said sectional faces, said connecting fingers having a course causing said connecting fingers to have said leadframe material at said at least one of said sectional faces, said connecting fingers having material reinforcements crossing at least one of said sectional faces, said connecting fingers having said material reinforcements being connecting fingers not to be connected to the chip;
   at least said connecting fingers adjacent said axis of symmetry crossing said axis of symmetry, at least said connecting fingers adjacent said axis of symmetry have material reinforcements crossing said axis of symmetry;
   said connecting fingers having said material reinforcements and said connecting fingers not having said material reinforcements being disposed alternatingly.

7. The leadframe according to claim 1, wherein said material reinforcements are anchor-shaped.

8. The leadframe according to claim 1, wherein said material reinforcements are paddle-shaped.

9. The leadframe according to claim 3, wherein said material reinforcements are anchor-shaped.

10. The leadframe according to claim 3, wherein said material reinforcements are paddle-shaped.

11. A chip-island-free leadframe, comprising:
    a main face extending in a plane, having sides, and defining sectional faces in cross-sections at right angles to said plane;
    a central region for accommodating a chip; and
    connecting fingers of a conductive leadframe material extending at least from one side thereof in a direction of said central region, at least some of said connecting fingers having a contact region adjacent said central region, said connecting fingers crossing at least one of said sectional faces, said connecting fingers having a course causing said connecting fingers to have said leadframe material at said at least one of said sectional faces, said connecting fingers having material reinforcements crossing at least one of said sectional faces, said connecting fingers having said material reinforcements being connecting fingers not to be connected to the chip.

12. A component, comprising:

a chip having an upper side and contact pads on said upper side;

a chip-island-free leadframe of a conductive material, said leadframe having:
- a main face extending in a plane, having sides, and defining sectional faces in cross-sections at right angles to said plane;
- a central region; and
- connecting fingers electrically connected to said contact pads;

a housing of a molding compound enclosing said chip and regions of said connecting fingers, said housing having an interior; and said connecting fingers crossing at least one of said sectional faces, said connecting fingers having a course in said interior of said housing causing said connecting fingers to have said material of said leadframe at said at least one of said sectional faces, said connecting fingers having material reinforcements crossing at least one of said sectional faces, said connecting fingers having said material reinforcements being connecting fingers not to be connected to the chip.

13. The component according to claim 12, wherein:

said central region accommodates said chip;

said connecting fingers extend at least from one of said sides of said main face in a direction of said central region; and at least some of said connecting fingers have a contact region adjacent said central region.

14. The component according to claim 12, wherein:

said central region accommodates said chip;

said connecting fingers are of said conductive material and extend at least from one of said sides of said main face in a direction of said central region; and at least some of said connecting fingers have a contact region adjacent said central region.

* * * * *